US006232907B1

(12) United States Patent
Nagaraj et al.

(10) Patent No.: US 6,232,907 B1
(45) Date of Patent: May 15, 2001

(54) POLARITY SHIFTING FLASH A/D CONVERTER AND METHOD

(75) Inventors: Krishnaswamy Nagaraj, Somerville, NJ (US); T. R. Viswanathan, Addison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/315,246

(22) Filed: May 20, 1999

Related U.S. Application Data

(60) Provisional application No. 60/087,182, filed on May 29, 1998.

(51) Int. Cl.$^7$ ...................................................... H03M 1/36
(52) U.S. Cl. ............................................ 341/159; 341/122
(58) Field of Search ................................... 341/122, 127, 341/132, 155, 159

(56) References Cited

U.S. PATENT DOCUMENTS

| | | | | |
|---|---|---|---|---|
| 4,143,363 | * | 3/1979 | Dottter, Jr. ............................ | 341/122 |
| 4,323,885 | * | 4/1982 | Carriere et al. ...................... | 341/118 |
| 4,658,431 | * | 4/1987 | Yokota ................................. | 382/103 |
| 4,696,018 | * | 9/1987 | Zaehringer et al. ................. | 375/328 |
| 5,429,002 | * | 7/1995 | Colman .............................. | 73/861.38 |
| 5,591,355 | * | 1/1997 | Ishikawa .............................. | 219/110 |

* cited by examiner

*Primary Examiner*—Michael Tokar
*Assistant Examiner*—Steven S. Paik
(74) *Attorney, Agent, or Firm*—Warren L. Franz; Wade James Brady III; Frederick J. Telecky, Jr.

(57) ABSTRACT

An A/D converter which includes a sample-and-hold circuit having an input and an output, a zero-crossing detector having an input coupled to the output of the sample-and-hold circuit and having an output indicative of a change in polarity of an input signal thereto and a polarity reverser having an input coupled to the output of the sample-and-hold circuit, a control terminal coupled to and under control of the output of the zero-crossing detector and an output terminal. A bank of comparators, preferably in a first and second array, each have inputs respectively coupled to the output of the polarity reverser, each comparator having an output. An encoder preferably having first and second portions is coupled to the output of the comparator, the first array preferably coupled to the first encoder portion and the second array preferably coupled to the second encoder portion, the encoder having an output. A multiplexer is optionally coupled to the first and second encoder portions and responsive to a predetermined signal from the second encoder portion to select signals from the outputs of one of the first and second encoders. A pair of buffers are optionally provided, a first buffer coupled between the output of the sample-and-hold circuit and both the polarity reverser and the zero crossing detector and a second buffer coupled between the output of the sample-and-hold circuit and the second array of comparators. First and second switches are optionally provided, the first switches being operational only during a first repeating time window for coupling the first buffer to the zero crossing detector and the polarity reverser and coupling the second buffer to the second array of comparators and the second switches are operational only during a second repeating time window not overlapping the first time window for coupling said second buffer to said zero crossing detector and said polarity reverser.

15 Claims, 5 Drawing Sheets

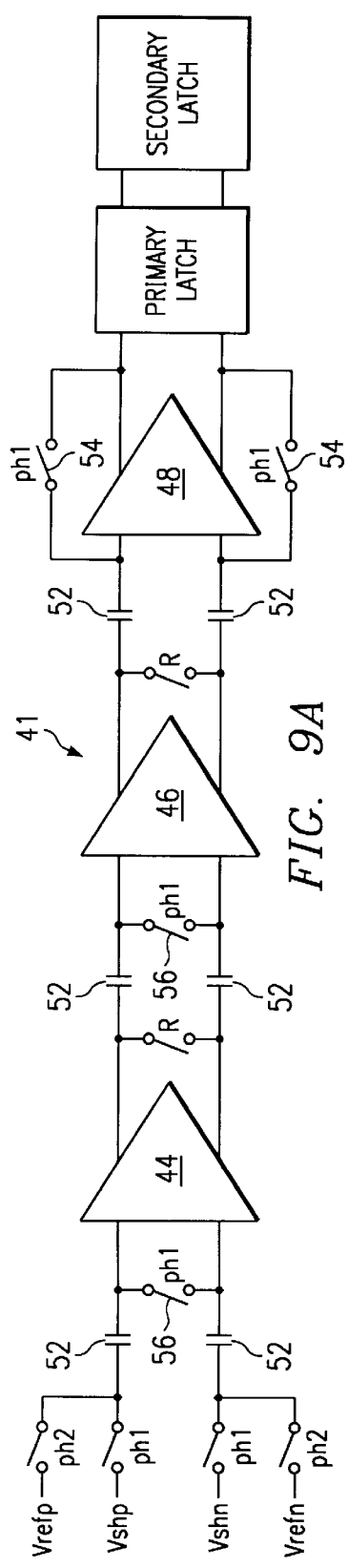
*FIG. 9A*
*FIG. 9B*
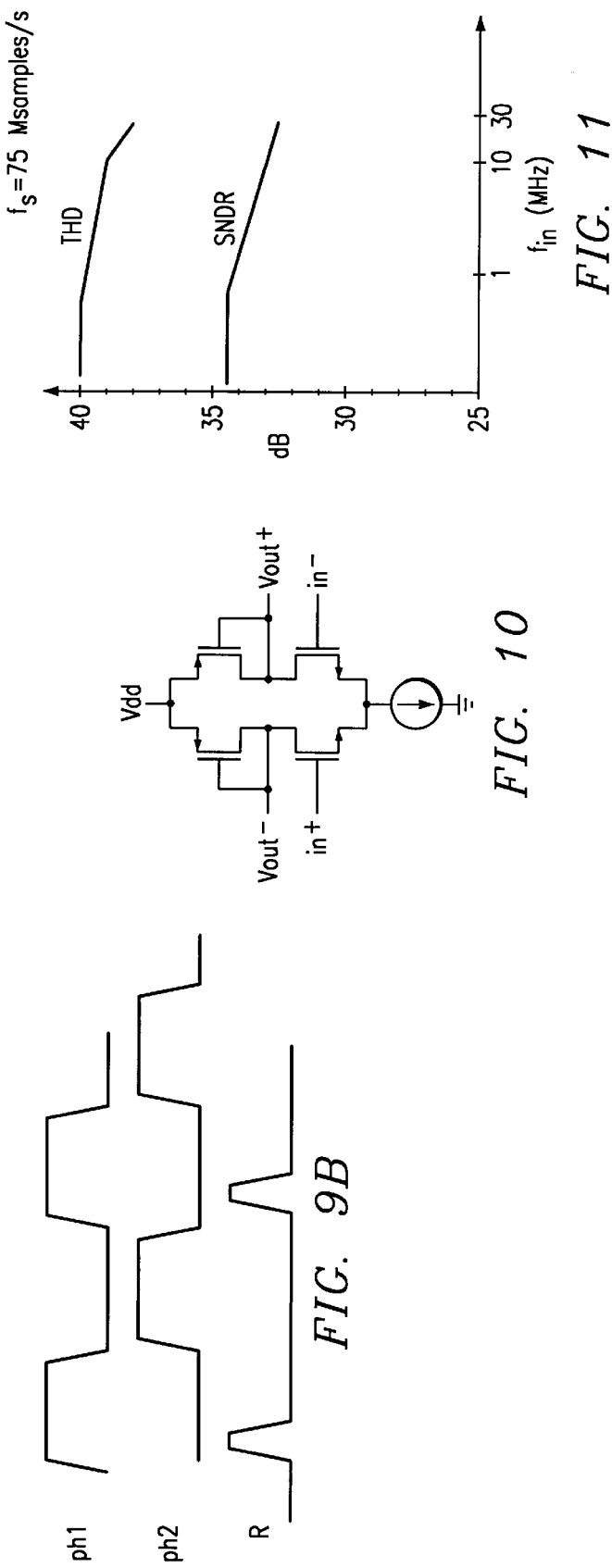
*FIG. 11*
*FIG. 10*

US 6,232,907 B1

POLARITY SHIFTING FLASH A/D CONVERTER AND METHOD

CROSS REFERENCE TO PRIOR APPLICATIONS

This application claims priority under 35 U.S.C. 119(e) based upon the filing of provisional application Serial No. 60/087,182, filed May 29, 1998 for Polarity Shifting Flash A/D Converter and Method, the contents of which are incorporated herein by reference.

FIELD OF THE INVENTION

This invention relates to apparatus and methods for high speed flash analog-to-digital (A/D) conversion.

BACKGROUND AND BRIEF DESCRIPTION OF THE PRIOR ART

A conventional six-bit flash A/D converter employs an array of 63 comparators and 63 latches. Known ways to reduce this complexity are multi-step, folding and interpolation techniques.

The multi-step approach uses two or more low resolution converters in a pipeline arrangement. This results in a dramatic reduction in the number of comparators. However, one requirement of this architecture is that the decision bits from one step must be made available in a timely fashion for use by the next step. Tolerance to errors can be built into this decision using redundancy, however a complete decision must still be made. This can be a problem at high speeds because of potential metastability. In a single-step flash A/D converter, stability problems can be overcome by providing additional latches at the outputs of the comparators. However, this cannot be done in a multi-step pipeline converter.

The folding technique involves folding the input several times to map different regions of the input into a single output range. It would be ideal to use a single such folder and then subject the folded signal to a low resolution flash conversion. For instance, if a signal could be folded eight times, three bits could be realized out of this operation itself. Then, only a three-bit flash conversion would be required following the folder. Unfortunately, the folding operation introduces nonlinearity except in the vicinity of the zero crossing of the output. For this reason, practical folding A/D converters use multiple folders that are offset from each other, with the net result that there are so many folded signals that each signal must be linear only over one least significant bit (LSB). Thus, folding by itself does not result in a reduction in the number of input devices or the input capacitance, but only results in a reduction in the number of latches and simplifies the encoder.

Interpolation can be applied to any flash A/D converter, with or without folding. In the simplest form of implementation of interpolation, a six-bit converter uses only 32 input preamplifiers with their reference voltages spaced two LSBs apart. By interpolating (or averaging) between adjacent preamplifier outputs, 32 more signals can be derived that actually represent virtual preamplifier outputs for the other 32 reference levels that were skipped.

A combination of folding and interpolation has been employed in several recent implementations. However, all of these have the drawback that the folding does not reduce the number of input stages or the total input capacitance.

SUMMARY OF THE INVENTION

In accordance with the present invention, the above described problems of the prior art are minimized and there is provided a high speed A/D converter architecture which is a hybrid between a folding converter and a two-step flash A/D converter. This architecture has the advantage that it reduces by about half the number of required comparators, thereby resulting in reduction of semiconductor chip area required and a reduction in input capacitance.

The invention also provides a method of high speed A/D conversion using a combination of folding and two-step flash A/D conversion techniques.

Briefly, there is provided an A/D converter which includes a sample-and-hold circuit having an input and an output, a zero-crossing detector having an input coupled to the output of the sample-and-hold circuit and having an output indicative of a change in polarity of an input signal thereto and a polarity reverser having an input coupled to the output of the sample-and-hold circuit, a control terminal coupled to and under control of the output of the zero-crossing detector and an output terminal. A bank of comparators, preferably in a first and second array, each have inputs respectively coupled to the output of the polarity reverser, each comparator having an output. An encoder preferably having first and second portions is coupled to the output of the comparator, the first array preferably coupled to the first encoder portion and the second array preferably coupled to the second encoder portion, the encoder having an output. A multiplexer is optionally coupled to the first and second encoder portions and responsive to a predetermined signal from the second encoder portion to select signals from the outputs of one of the first and second encoders. A pair of buffers are optionally provided, a first buffer coupled between the output of the sample-and-hold circuit and both the polarity reverser and the zero crossing detector and a second buffer coupled between the output of the sample-and-hold circuit and the second array of comparators. First and second switches are optionally provided, the first switches being operational only during a first repeating time window for coupling the first buffer to the zero crossing detector and the polarity reverser and coupling the second buffer to the second array of comparators and the second switches are operational only during a second repeating time window not overlapping the first time window for coupling said second buffer to said zero crossing detector and said polarity reverser.

In accordance with a second embodiment, there is provided an A/D converter which includes a sample-and-hold circuit having an input and an output, a zero-crossing detector having an input coupled to the output of the sample-and-hold circuit and having an output indicative of a change in polarity of an input signal thereto and a reference voltage source. A polarity reverser is provided having an input coupled to the reference voltage source and the output terminal of the zero crossing detector to provide a reference voltage output of a polarity determined by the output of the zero crossing detector. A bank of comparators is provided which includes a first array of comparators and a second array of comparators, each comparator having inputs respectively coupled to the output of the polarity reverser and the reference voltage source with each comparator having an output. An encoder having a first encoder portion and a second encoder portion is provided with the first encoder portion having inputs respectively coupled to the outputs of the first array of comparators and the second encoder portion having inputs respectively coupled to the outputs of the second encoder portion. A first reference ladder is coupled to the reference voltage output and the polarity reverser, the output of said reference ladder and the output of the sample and hold circuit coupled to the input of the first array of comparators. A second reference ladder is coupled to the reference voltage source and has an output coupled to the second array of comparators along with the output of the sample and hold circuit. The circuit further includes a multiplexer coupled to the first and second encoder portions and responsive to a predetermined signal from the second encoder portion to select signals from the outputs of one of the first and second encoders. The predetermined signal is indicative of an input amplitude below a predetermined value. The circuit optionally further includes a first buffer coupled between the output of the sample-and-hold circuit and both the polarity reverser and the zero crossing detector and a second buffer coupled between the output of said sample-and-hold circuit and the second array of comparators.

BRIEF DESCRIPTION OF THE DRAWINGS

Embodiments of the invention have been chosen for purposes of illustration and description and are shown with reference to the accompanying drawings, wherein:

FIG. 9A is a schematic diagram of a comparator;

FIG. 9B is a timing diagram for the comparator of FIG. 9A;

FIG. 10 shows details of a preamplifier portion of the comparator of FIG. 9A;

FIG. 11 shows variation of signal-to-noise-and-distortion-ratio (SNDR) and THD with input frequency;

Throughout the drawings, like or similar elements are referred to by like numerals.

DESCRIPTION OF THE PREFERRED EMBODIMENTS

Figure 1:
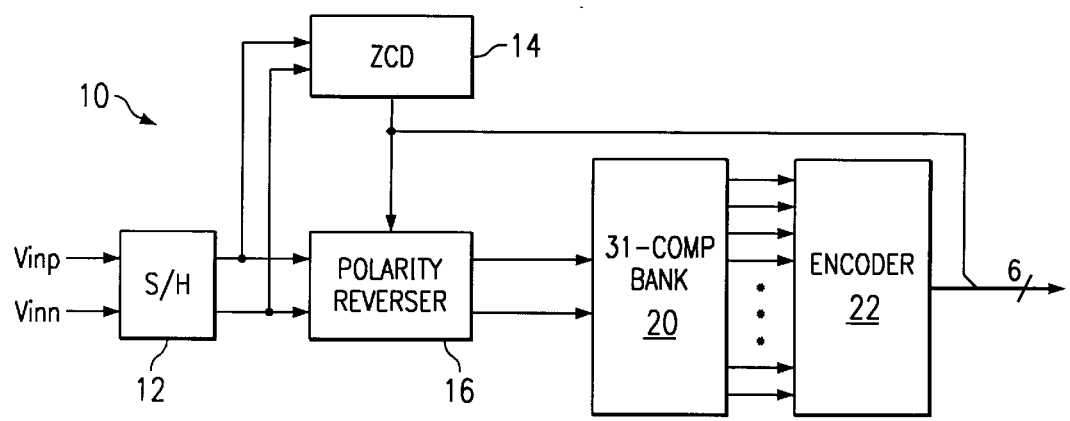
FIG. 1 is a block diagram of an embodiment of an A/D converter in accordance with the principles of the present invention.

FIG. 1 shows an embodiment 10 of a flash A/D converter illustrating the principles of the invention. For illustrative purposes, a six-bit converter is shown. The input, Vinp and Vinn, is sampled and held by a differential sample-and-hold (S/H) (either sample-and-hold or track-and-hold) circuit 12. The output of the S/H circuit 12 is fed into a zero-crossing detector (ZCD) or polarity detector 14. The output of ZCD 14 controls an analog polarity reverser 16 which is connected between S/H circuit 12 and a comparator bank 20 which, in the present example, comprises 31 comparators.

Whenever the input signal polarity is negative, polarity reverser 16 reverses the polarity of the signal delivered for flash conversion by the comparator bank 20. Thus, comparator bank 20 only sees one-half of the input signal range, thereby requiring only one-half the number of comparators for the same A/D conversion resolution. The most significant bit (MSB) is provided by the output of ZCD 14. With a fully differential architecture, the polarity reverser 16 can simply be a set of switches as is well known in the art and requires no further description.

Figure 2:
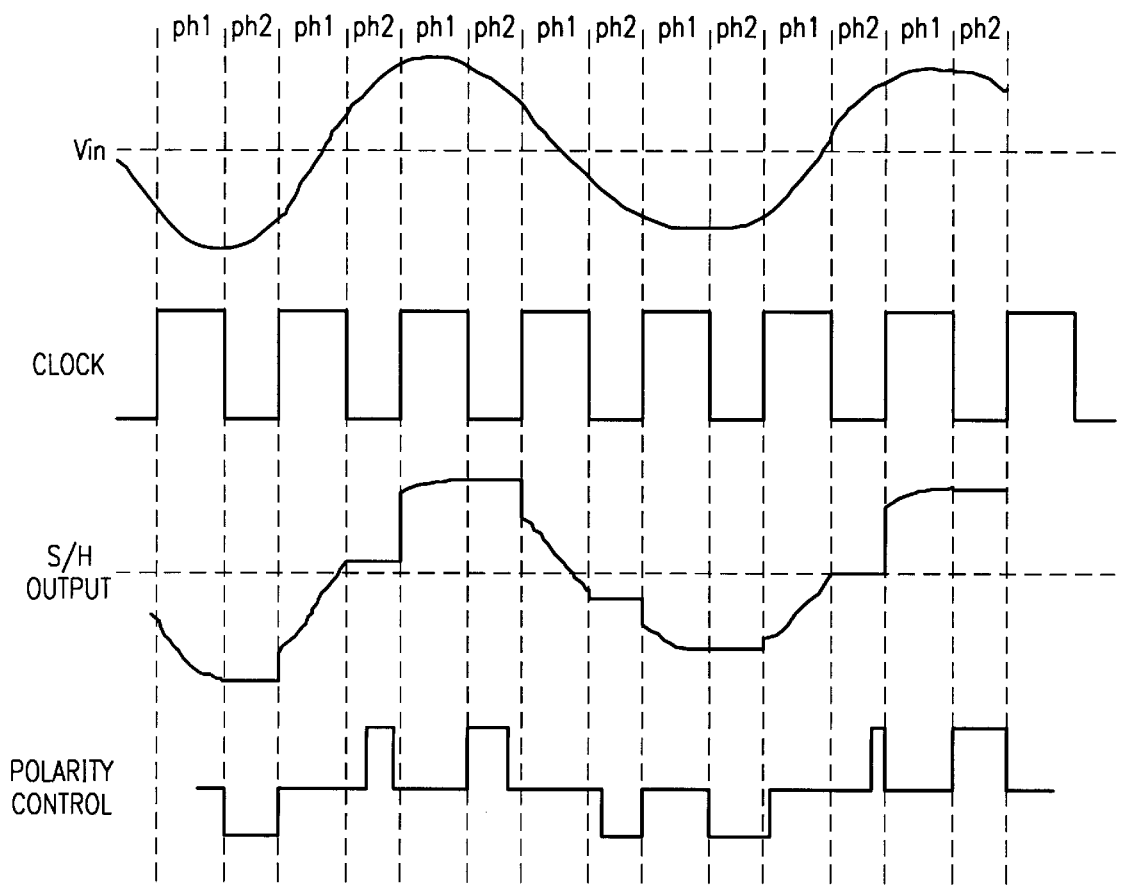
FIG. 2 is a timing diagram for the converter of FIG. 1.

The clocking scheme required for the operation of circuit 10 of FIG. 1 is shown in FIG. 2. During phase 1 (ph1) of a clock cycle, the S/H circuit 12 is in the tracking mode. During phase 2 (ph2), the input sample is held while the polarity detection and reversal, if required, are provided. At the same time, the output of the polarity reverser 16 is sampled by individual sampling capacitors in the comparators, as in FIG. 9 (to be discussed hereinbelow). During ph2 of the next clock interval, the comparator inputs are switched to appropriate reference voltages while the main S/H circuit 12 returns to the tracking mode.

There are two problems with the simple architecture of FIG. 1. First, if there are imperfections in polarity detector 14, a signal that is actually negative may not be reversed in polarity before reaching the comparator array 20, or a signal that is positive may be reversed. Both of these errors result in a negative input signal at the comparator inputs in bank 20. Because an error in polarity detection is likely only when the input sample is close to zero, the range of negative signals that can occur at the comparator inputs is small. This is easily accommodated by using a few extra comparators. However, a second and more serious problem is that with inputs that are close to zero, the polarity detector ZCD 14 takes longer to make a decision within the clock interval. This problem is overcome by modifying the architecture as shown in FIG. 3.

Figure 3:
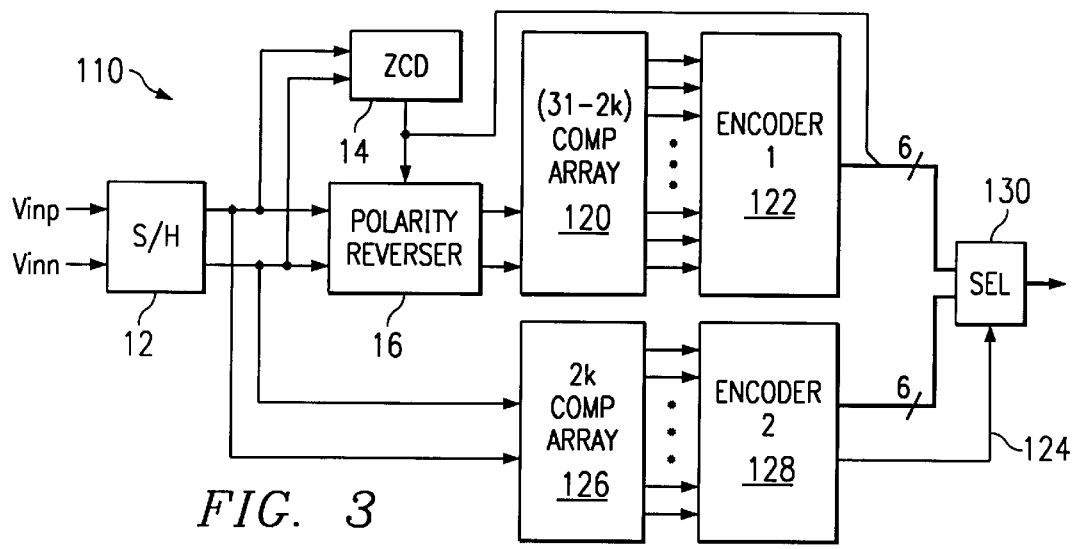
FIG. 3 is a block diagram of a first modified embodiment of the converter of FIG. 1.

FIG. 3 shows a modified A/D converter 110 having similar S/H circuit 12, ZCD circuit 14 and polarity reverser 16 components, but wherein the previously described comparator bank 20 now has two subarray parts. One part 120 acts on the input signal received as before either directly or inverted through the polarity reverser 16. The other part 126 acts directly on the output of S/H circuit 12 without polarity reversal. Subarray 126 comprises 2 k comparators and functions as a full input signal range flash A/D converter for input signals close to the zero voltage crossing point where k is a small integer and is much less than $2^n$ where n is the resolution in bits of the A/D converter. Subarray 120 (for a six-bit resolution) comprises 31—2 k comparators which receive the input signal from the polarity reverser 16, and functions as described hereinabove with reference to circuit 10 and array 20 of FIG. 1. The two parts 120, 126 of the comparator array are connected to separate encoders 122, 128 which both produce six-bit outputs. Encoder 128 which is connected to the 2 k comparators (subarray 126) has an extra output 124 which goes high (or, alternatively, low) whenever the input signal level at the output of S/H circuit 12 is close to zero within the range of the 2 k comparators. This range confirmation signal 124 operates an output multiplexer (SEL) 130 which selects the output of the lower encoder whenever it is high (or low), i.e., whenever the digital output is fully defined by the subarray 126. This ensures that whenever the sample falls within k LSBs around zero, the conversion is performed by the full flash converter. The polarity reverser is used only when the input signal amplitude is larger than k LSBs, thus eliminating the potential problem due to the insensitivity of the polarity detector 16 at small signal levels. The choice of k is determined by the sensitivity of the zero-crossing detector.

For the arrangement of FIG. 3, even when the input signal is small, it is possible for ZCD 14 to make a late decision. This would operate the polarity reverser 16 at some point during the clock phase. Though the output multiplexer 130 ensures that the output of polarity reverser 16 is not used for the conversion, late operation of ZCD 14 may still cause a kickback effect on the output of S/H 12 which, in turn, may adversely affect the direct conversion operation of the lower comparator bank 126. This is avoided by using two buffers 32, 34 at the output of S/H 12, as shown by circuit 210 of FIG. 4. The use of two buffers 32, 34 does not result in a significant increase in power because each buffer now drives a smaller number of comparators.

Figure 4:
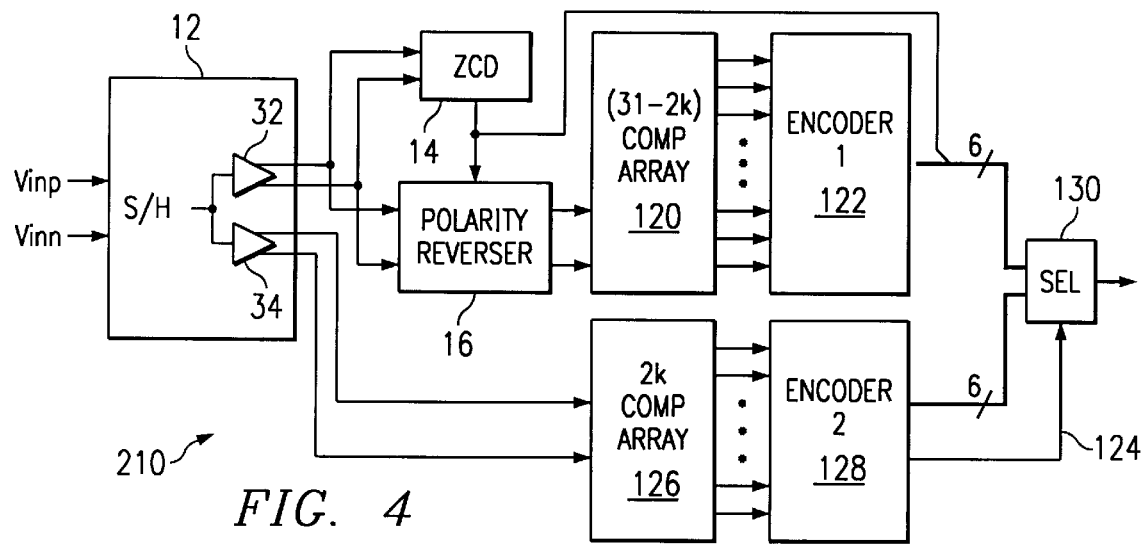
FIG. 4 is block diagram of a second modified embodiment of the converter of FIG. 1.
Figure 5:
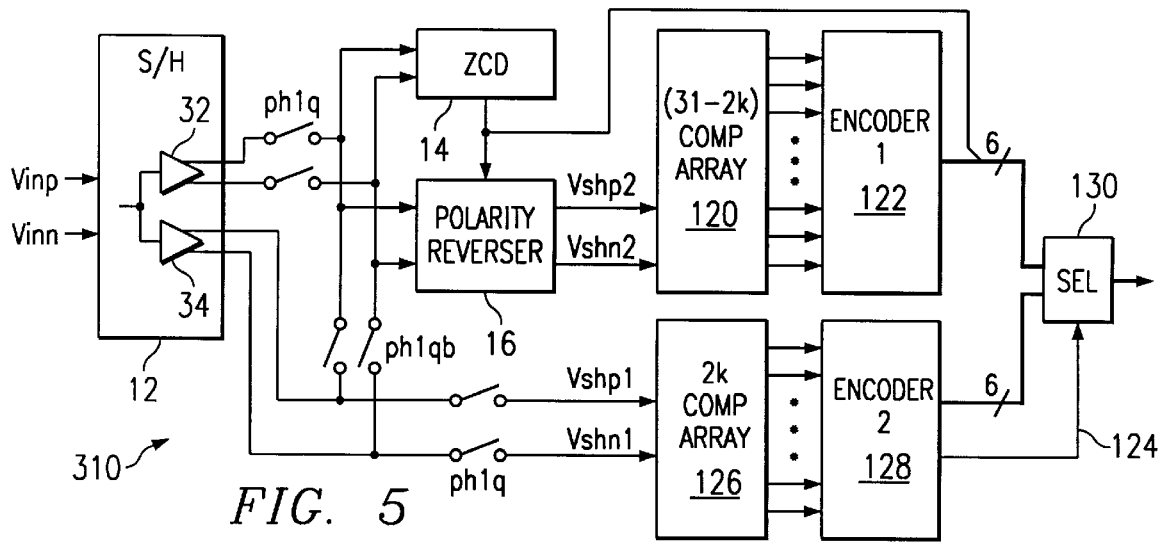
FIG. 5 is a block diagram of a variation of the embodiment of FIG. 4.
Figure 6:
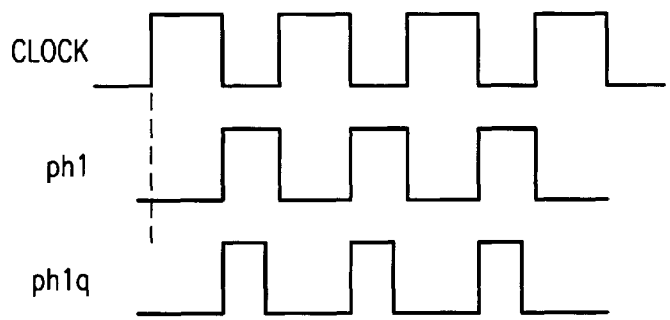
FIG. 6 is a timing diagram for the embodiment of FIG. 5.

Any gain and offset mismatch between the two buffers 32, 34 in FIG. 4 may, however, introduce a differential nonlinearity (DNL) at the transition between the two parts 120, 126 of the comparator array. At the six-bit level, it should be possible to keep this within acceptable limits. The situation can be further improved by the modification shown in FIG. 5. The timing for the operation of this scheme is shown in FIG. 6. Here the clock phase during which the input is sampled by the comparator array is divided into two parts. During the first part ph1q, the output from buffer 34 is sampled by the lower 2 k comparators of subarray 126, whereas the output from buffer 32 is sampled by the upper comparators of subarray 120. This allows both buffers to charge up their load capacitance. As soon as ph1q goes low, the input sampling switches in the lower 2 k comparators are opened, thus holding the input sample on their capacitors. Simultaneously, the input to polarity reverser 16 is switched from buffer 32 to buffer 34 by the opening of switches ph1q and the closing of switches ph1qb which are closed when switches ph1q are open. This makes up for any mismatches between the buffers 32 and 34 and forces the input seen by all of the comparators to be the same (the output of buffer 32). Buffer 34 only serves to precharge the sampling capacitors in the upper comparators to be close to the input sample, so that only a small time interval between the falling edge of ph1q and the falling edge of ph1 (FIG. 6) is adequate to make up for any mismatch between buffers 32 and 34. This modification results in a reduction in speed of operation.

Figure 7A:
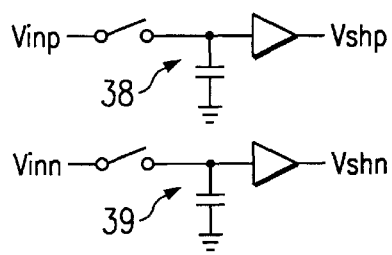
FIG. 7A is a simplified schematic diagram of a sample and hold (S/H) circuit.
Figure 7B:
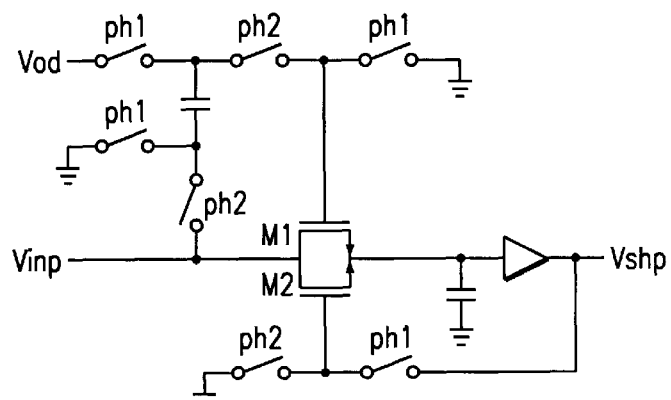
FIG. 7B is a diagram of the details of a portion of the circuit of FIG. 7A.

FIG. 7A shows a simplified circuit schematic of an exemplary implementation of the S/H circuit 12. It uses a pseudo differential configuration that has two identical single-ended track-and-hold circuits 38, 39, one for the positive path and one for the negative path. Each circuit 38, 39 may comprise a pass transistor switch (shown as a switch and in detail in FIG. 7B) followed by a buffer amplifier. Details of implementation of a suitable sampling switch are shown in FIG. 7B. Two measures are taken here to minimize signal dependent switch feedthrough that can cause distortion. First, the gate of the pass transistor M1, instead of being switched between 0 and the supply voltage, is switched between 0 and a voltage Vin+Vod by operation of switches ph1 and ph2 which are operated whereby switches ph1 are closed and switches ph2 are open when signal ph1 in FIG. 6 is high and switches ph1 is open and switches ph2 are closed when signal ph1 in FIG. 6 is low. Thus, the gate overdrive for transistor M1 is made independent of Vin (Vinp and Vinn). This, in turn, makes the charge feedthrough during the turn-off transient, signal independent. Another source of signal dependent feedthrough is the gate-to-drain overlap capacitance of MOS transistor M1. This is minimized by using a dummy device transistor M2 in tandem with transistor M1, whose gate is switched between the output Vshp of the S/H circuit and ground in accordance with the state of signals ph1 and ph2 as discussed above. Thus, the drain-to-gate capacitances of transistors M1 and M2 experience opposite transitions during the turning off of transistor M1, canceling their feedthrough to a first order. Note that transistor M2 is always off. See copending application Ser. No. 09/069,495, filed Apr. 29, 1998, the entirety of which is incorporated herein by reference.

Figure 8:
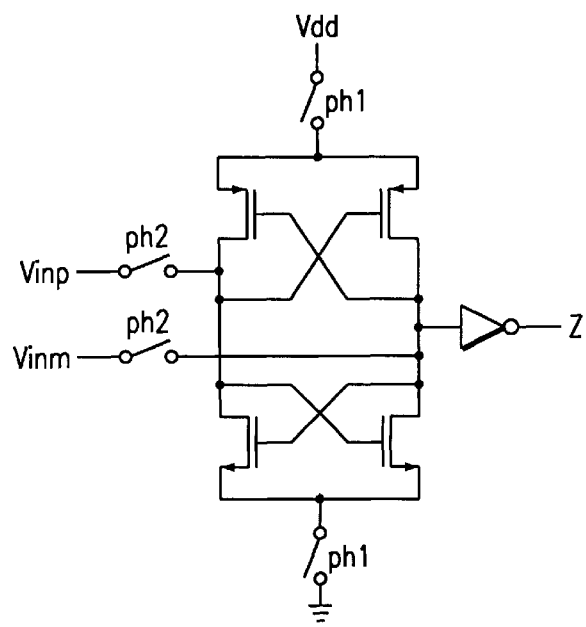
FIG. 8 is a schematic diagram of a zero-crossing detector.

A circuit schematic diagram of an implementation of ZCD 14 is shown in FIG. 8. Zero-crossing detector 14 comprises a simple set-reset latch. During the clock phase ph2 (when S/H 12 is tracking), the current sources to the latch are turned off and the latch output terminals are connected to the inputs ph2. During the next ph1, the latch is disconnected from the inputs and its current sources are restored, allowing it to latch.

A simplified schematic of an implementation of a comparator 41 of bank 20 or subarrays 120, 126 is shown in FIG. 9A. Comparator 41 comprises three simple differential amplifiers 44, 46, 48. Capacitors 52 are used for interstage coupling. During clock phase ph1, the preamplifiers are first reset by a narrow reset pulse that briefly closes switches R and which short circuit the outputs together of amplifiers 44 and 46. Simultaneously, the input comparator 41 is set to zero by closure of switches ph1. At the end of the output reset, the offset voltages of the amplifier stages are stored on the coupling capacitors 52. At the end of ph1, the feedback switches 54 around the third stage 48, as well as the input shorting switches 56 in stages 1 (44) and 2 (46), are opened in that order, to ensure proper storing of the offset voltages. During ph2, the preamplifiers amplify the input sample. The preamplifiers within the comparator 41 are simple, well known differential pairs with diode connected MOSFET loads, as shown in FIG. 10 and require no further explanation.

An experimental prototype based on the architecture of FIG. 4 was implemented in a standard CMOS technology. The prototype circuit used a total of 40 comparators (16 comparators in lower bank 126 and 24 comparators in upper bank 120). This is somewhat conservative and the number of comparators in the lower bank can be smaller (or larger, if desired).

Figure 12:
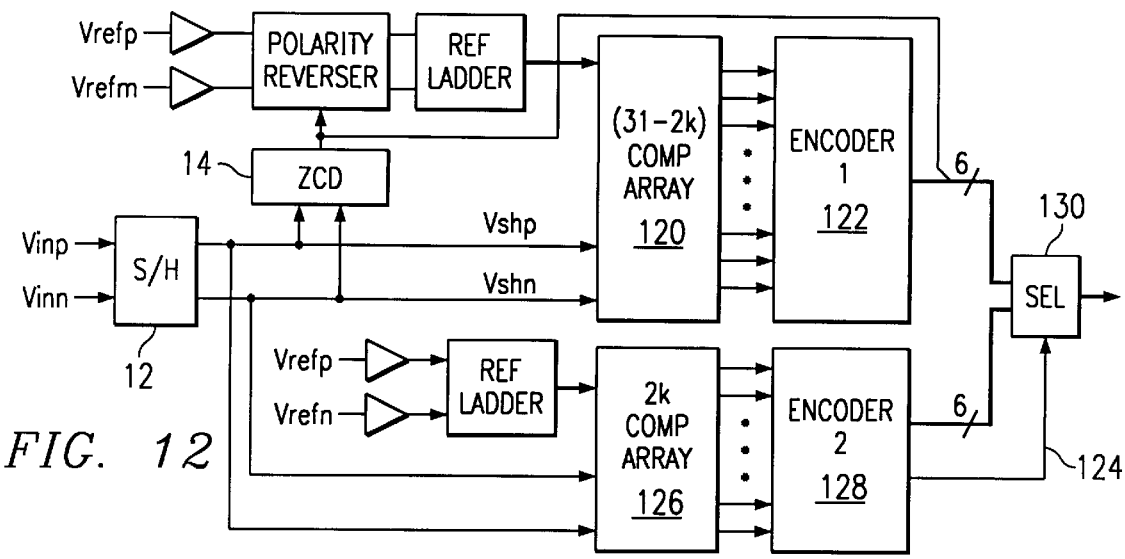
FIG. 12 is a block diagram of another embodiment of a converter employing reference reversal.

The main factor that limits the speed of the above architecture is the response time of the zero-crossing detector. Although the use of a separate comparator bank for small signals ensures that the zero-crossing detector is used only for signals that have relatively large amplitude, the minimum response time achievable is still about a nanosecond. This situation can be improved significantly by using the architecture shown in FIG. 12. This architecture employs the polarity reversal of the reference voltage rather than that of the input signal. The principal of operation of this circuit is as follows: During the clock phase ph1, the input is sampled by a single S/H circuit. During the phase ph2, the S/H 12 holds the signal. This held signal is re-sampled by capacitors in the comparators 120, 126. Simultaneously, the polarity of the signal is detected by a zero-crossing detector 14. During the next ph1, the comparator inputs are connected to appropriate taps on a reference voltage ladder (not shown). The polarity of the main reference voltage is reversed whenever the input signal polarity is detected as being negative. Even in this case, there is a probability that the zero-crossing detector 14 will not be able to make a complete decision. To overcome this, the reference polarity reversal is not applied to 2 k comparators 126 around the zero signal level. Two encoders 122, 128 are used, and the output from the appropriate encoder is selected in the same manner as for the architecture of FIG. 3. To avoid the kickback from the polarity reversal operation on the lower set of comparators 126, separate reference buffers and reference ladders can be used. This is similar to using two separate input buffers as in FIG. 4. Again, mismatch between the two reference circuits would be a manageable issue at the six-bit level.

Figure 13:
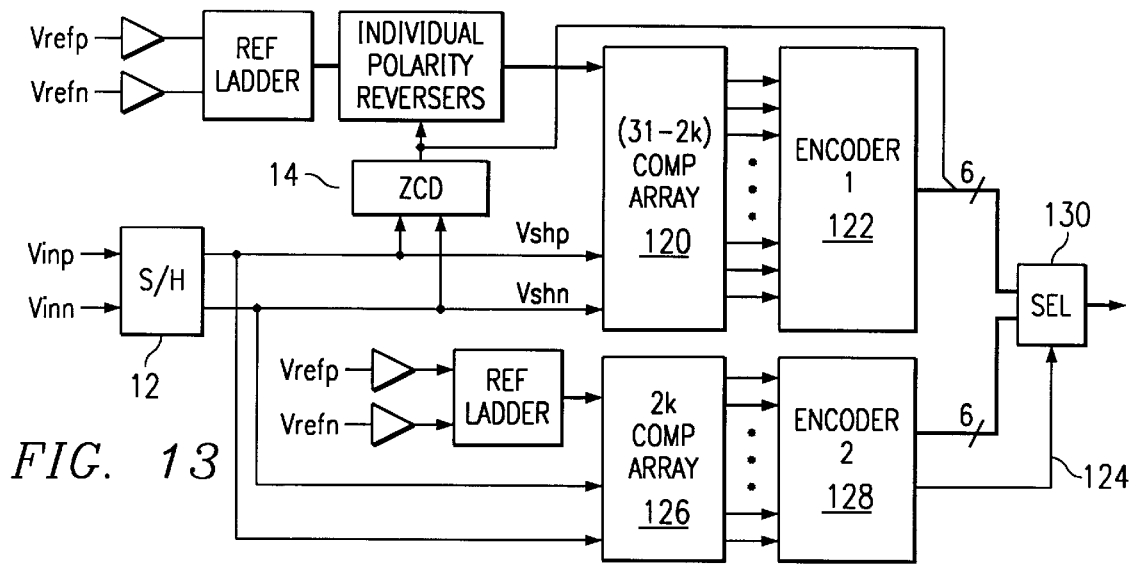
FIG. 13 is a block diagram of an alternative embodiment employing reference reversal.
Figure 14:
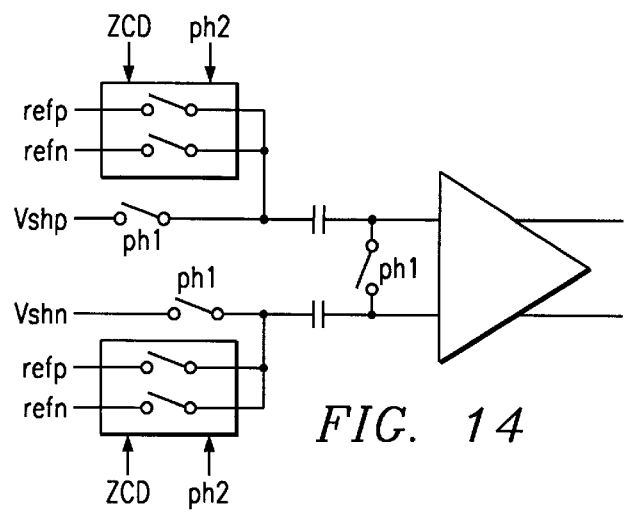
FIG. 14 shows integration of the reference reversal function into individual comparators.

An alternative implementation is shown in FIG. 13. Here, the reference polarity reversal is done at the level of each comparator rather than at the main reference inputs. This avoids the need for introducing large switches in series with the references. The function of reversing individual references can be integrated into each comparator, as shown in FIG. 14.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. An A/D converter, comprising:
   a sample-and-hold circuit having an input and an output;
   a zero-crossing detector having an input coupled to the output of the sample-and-hold circuit and having an output indicative of a change in polarity of an input signal thereto;
   a polarity reverser having an input coupled to the output of the sample-and-hold circuit, a control terminal coupled to and under control of the output of the zero-crossing detector and an output terminal;
   a bank of comparators, each comparator having inputs respectively coupled to the output of the polarity reverser and a reference voltage source, and each comparator having an output; and
   an encoder having inputs respectively coupled to the outputs of the bank of comparators and an output.

2. The A/D converter of claim 1 wherein said bank of comparators comprises a first array of comparators coupled to said polarity reverser and a second array of comparators coupled to said sample-and-hold circuit and said encoder comprises a first encoder portion coupled to said first array of comparators and a second encoder portion coupled to said second array of comparators.

3. The A/D converter of claim 2 further including a multiplexer coupled to said first and second encoder portions and responsive to a predetermined signal from said second encoder portion to select signals from the outputs of one of said first and second encoders.

4. The A/D converter of claim 3 wherein said predetermined signal is indicative of an input amplitude below a predetermined value.

5. The A/D converter of claim 3 further including a first buffer coupled between the output of said sample-and-hold circuit and both said polarity reverser and said zero crossing detector and a second buffer coupled between the output of said sample-and-hold circuit and said second array of comparators.

6. The A/D converter of claim 4 further including a first buffer coupled between the output of said sample-and-hold circuit and both said polarity reverser and said zero crossing detector and a second buffer coupled between the output of said sample-and-hold circuit and said second array of comparators.

7. The A/D converter of claim 6 further including first switches operational only during a first repeating time window for coupling said first buffer to said zero crossing detector and said polarity reverser and coupling said second buffer to said second array of comparators and second switches operational only during a second repeating time window not overlapping said first time window for coupling said second buffer to said zero crossing detector and said polarity reverser.

8. An A/D converter, comprising:
   a sample-and-hold circuit having an input and an output;
   a zero-crossing detector having an input coupled to the output of the sample-and-hold circuit and having an output indicative of a change in polarity of an input signal thereto;
   a reference voltage source;
   a polarity reverser having an input coupled to the reference voltage source and said output terminal of said zero crossing detector to provide a reference voltage output of a polarity determined by said output of said zero crossing detector;
   a bank of comparators comprising a first array of comparators and a second array of comparators, each comparator having inputs respectively coupled to the output of the polarity reverser and a reference voltage source, and each comparator having an output;
   an encoder comprising a first encoder portion and a second encoder portion, said first encoder portion having inputs respectively coupled to the outputs of said first array of comparators and said second encoder portion having inputs respectively coupled to the outputs of said second encoder portion;
   a first reference ladder coupled to the reference voltage output of said polarity reverser;
   said output of said reference ladder and said output of said sample and hold circuit coupled to the input of said first array of comparators;
   a second reference ladder coupled to said reference voltage source and having an output coupled to said second array of comparators along with said output of said sample and hold circuit.

9. The A/D converter of claim 8 further including a multiplexer coupled to said first and second encoder portions and responsive to a predetermined signal from said second encoder portion to select signals from the outputs of one of said first and second encoders.

10. The A/D converter of claim 9 wherein said predetermined signal is indicative of an input amplitude below a predetermined value.

11. The A/D converter of claim 8 further including a first buffer coupled between the output of said sample-and-hold circuit and both said polarity reverser and said zero crossing detector and a second buffer coupled between the output of said sample-and-hold circuit and said second array of comparators.

12. The A/D converter of claim 9 further including a first buffer coupled between the output of said sample-and-hold circuit and both said polarity reverser and said zero crossing detector and a second buffer coupled between the output of said sample-and-hold circuit and said second array of comparators.

13. The A/D converter of claim 10 further including a first buffer coupled between the output of said sample-and-hold circuit and both the input to said zero crossing detector and said first array of comparators and a second buffer coupled between the output of said sample-and-hold circuit and said second array of comparators.

14. The A/D converter of claim 11 further including a first buffer coupled between the output of said sample-and-hold circuit and both the input to said zero crossing detector and said first array of comparators and a second buffer coupled between the output of said sample-and-hold circuit and said second array of comparators.

15. The A/D converter of claim 12 further including a first buffer coupled between the output of said sample-and-hold circuit and both the input to said zero crossing detector and said first array of comparators and a second buffer coupled between the output of said sample-and-hold circuit and said second array of comparators.

* * * * *